(12) United States Patent
Peterson et al.

(10) Patent No.: US 11,251,103 B2
(45) Date of Patent: Feb. 15, 2022

(54) SEGMENTED HEATSINK

(71) Applicant: INTEL CORPORATION, Santa Clara, CA (US)

(72) Inventors: Jerrod Peterson, Hillsboro, OR (US); Carin Lundquist Ruiz, Portland, OR (US); Akhilesh P. Rallabandi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/370,621

(22) Filed: Mar. 29, 2019

(65) Prior Publication Data

US 2019/0252286 A1 Aug. 15, 2019

(51) Int. Cl.
| | | |
|---|---|---|
| *H01L 23/367* | (2006.01) | |
| *H01L 23/40* | (2006.01) | |
| *H01L 23/36* | (2006.01) | |
| *H01L 23/427* | (2006.01) | |
| *H05K 7/20* | (2006.01) | |

(52) U.S. Cl.
CPC .......... *H01L 23/367* (2013.01); *H01L 23/36* (2013.01); *H01L 23/4006* (2013.01); *H01L 23/427* (2013.01)

(58) Field of Classification Search
CPC .............. H05K 7/2039; H05K 7/2049; H05K 7/20154; H01L 23/40–4006; H01L 23/4093; G06F 1/20; G06F 1/203
USPC ........................... 361/709–710, 719, 679.54; 165/80.2–80.3; 257/718–719, 721–722
See application file for complete search history.

(56) References Cited

U.S. PATENT DOCUMENTS

| | | | |
|---|---|---|---|
| 6,281,573 B1 * | 8/2001 | Atwood | H01L 23/3675 165/80.3 |
| 2005/0117307 A1 | 6/2005 | Tanaka | |
| 2005/0146023 A1 * | 7/2005 | Edwards | H01L 23/4093 257/707 |

(Continued)

FOREIGN PATENT DOCUMENTS

| | | |
|---|---|---|
| CN | 111757637 A | 10/2020 |
| EP | 3716323 A1 | 9/2020 |

(Continued)

OTHER PUBLICATIONS

WO 2014/147681 English Translation, Keisuke, Sep. 2014, Populated board, pressing member, and electronic device (Year: 2014).*

(Continued)

*Primary Examiner* — Zachary Pape
*Assistant Examiner* — Amir A Jalali
(74) *Attorney, Agent, or Firm* — Patent Capital Group

(57) ABSTRACT

Particular embodiments described herein provide for an electronic device that can be configured to enable a segmented heatsink. The electronic device can include a printed circuit board, a substrate, where the substrate is over the printed circuit board, at least two heat sources over the substrate, and a segmented heatsink secured to the printed circuit board, where the segmented heatsink has at least two independent heatsink segments, where each heatsink segment corresponds to at least one heat source and is configured to draw heat from the corresponding heat source. In an example, the heat sources are at a different height.

18 Claims, 8 Drawing Sheets

(56) References Cited

U.S. PATENT DOCUMENTS

| | | | | | |
|---|---|---|---|---|---|
| 2010/0091462 | A1* | 4/2010 | Imazato | | H05K 1/0216 361/709 |
| 2013/0153190 | A1* | 6/2013 | Gan | | H01L 23/4093 165/185 |
| 2014/0252634 | A1* | 9/2014 | Hung | | H01L 23/3675 257/773 |
| 2015/0077944 | A1* | 3/2015 | Li | | H01L 23/02 361/719 |
| 2015/0303126 | A1* | 10/2015 | Takahashi | | H01L 23/10 257/77 |
| 2016/0150631 | A1* | 5/2016 | Matsumoto | | H05K 1/0204 361/720 |
| 2016/0205784 | A1* | 7/2016 | Kyle | | H05K 3/301 361/679.02 |
| 2016/0276243 | A1* | 9/2016 | Smalley | | H01L 23/3677 |
| 2017/0092619 | A1* | 3/2017 | Refai-Ahmed | | H01L 24/00 |
| 2017/0164520 | A1* | 6/2017 | Barron | | H05K 7/20509 |
| 2018/0054914 | A1* | 2/2018 | James | | H01L 23/40 |
| 2019/0045658 | A1 | 2/2019 | Pidwerbecki et al. | | |
| 2019/0132938 | A1* | 5/2019 | Mira | | H05K 1/0209 |
| 2019/0200485 | A1* | 6/2019 | Coteus | | H01L 23/473 |
| 2019/0259632 | A1* | 8/2019 | Isaacs | | B21D 53/022 |

FOREIGN PATENT DOCUMENTS

| | | | |
|---|---|---|---|
| WO | 2014147681 | | 9/2014 |
| WO | WO 2914/147681 | * | 9/2014 |

OTHER PUBLICATIONS

EPO dated Sep. 2, 2020—Extended European Search Report and Search Opinion from European Application No. 20158346.5; 9 pages.

* cited by examiner

SEGMENTED HEATSINK

TECHNICAL FIELD

This disclosure relates in general to the field of computing and/or device cooling, and more particularly, to a segmented heatsink.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
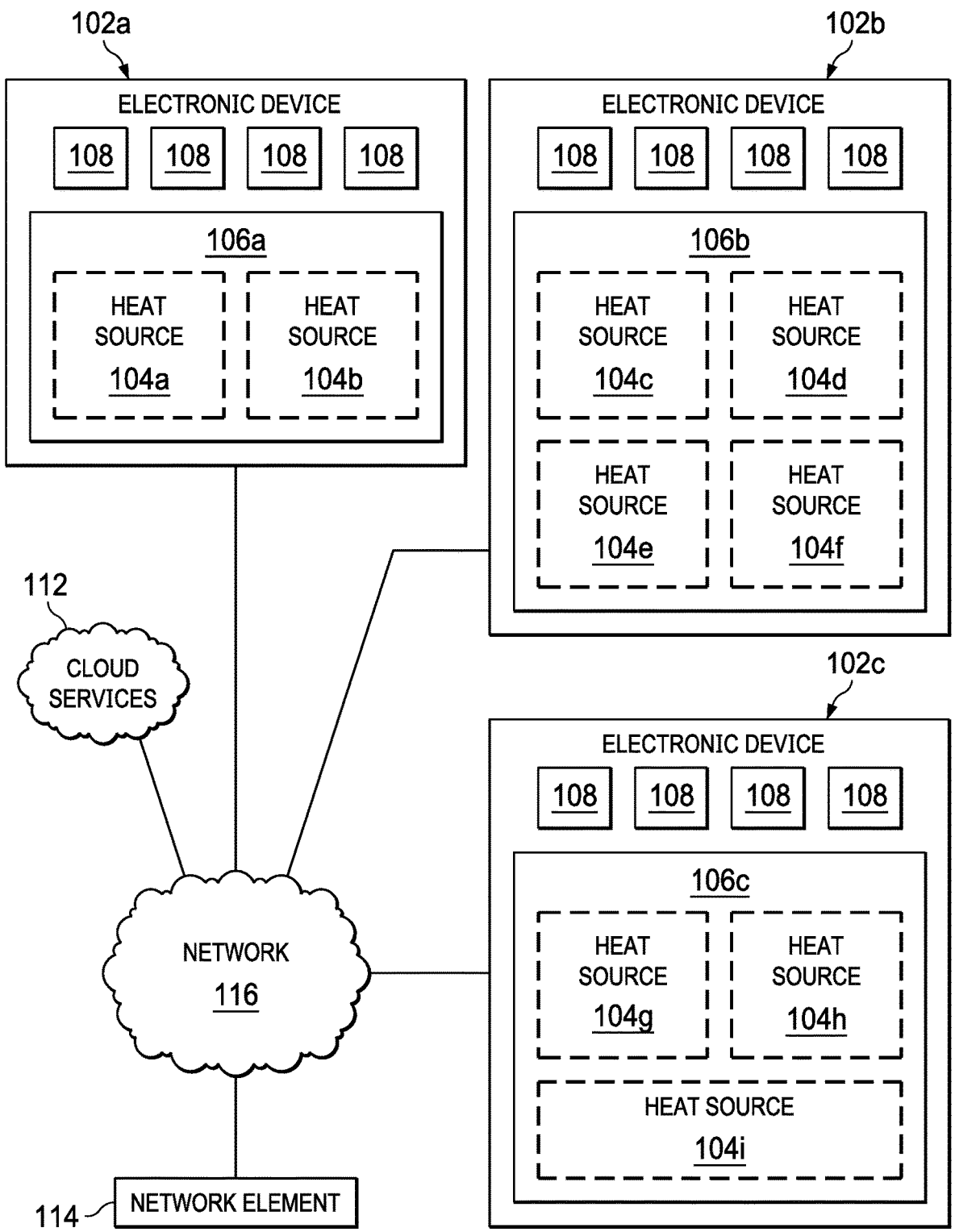
FIG. 1 is a simplified block diagram of a system to enable a segmented heatsink, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a segmented heatsink. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one element, component, or layer disposed over or under another element, component, or layer may be directly in contact with the other element, component, or layer or may have one or more intervening elements, components, or layers. Moreover, one element, component, or layer disposed between two elements, components, or layers may be directly in contact with the two elements, components, or layers or may have one or more intervening elements, components, or layers. In contrast, a first element, component, or layer "on" a second element, component, or layer is in direct contact with that second element, component, or layer. Similarly, unless explicitly stated otherwise, one feature disposed between two features may be in direct contact with the adjacent features or may have one or more intervening elements, components element, component, or, or layers.

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

FIG. 1 is a simplified block diagram of an electronic device configured with a segmented heatsink secured to two or more heat sources, in accordance with an embodiment of the present disclosure. In an example, an electronic device can include two or more heat sources. Each of the two or more heat sources may be associated with a corresponding segmented heatsink. For example, as illustrated in FIG. 1, electronic device 102a includes heat source 104a and 104b, a corresponding segmented heatsink 106a, and one or more electronics 108. In addition, electronic device 102b includes heat sources 104c-104f, a segmented heatsink 106b, and one or more electronics 108. Also, electronic device 102c includes heat sources 104g-104i, a segmented heatsink 106c, and one or more electronics 108. Each segmented heatsink 106a and 106b may be a cold plate or some other heat transfer component or element to transfer heat away from a heat source. Each of electronic devices 102a-102c may be in communication with each other, cloud services 112, and/or network element 114 using network 116. In some examples, one or more of electronic device 102a-102c may be stand-alone devices and not connected to network 116 or another device.

Each of heat sources 104a-104i may be a heat generating device (e.g., processor, logic unit, field programmable gate array (FPGA), chip set, integrated circuit (IC), a graphics processor, graphics card, battery, memory, or some other type of heat generating device). Each of segmented heatsinks 106a-106e can be configured as a segmented thermal cooling device to help remove thermal energy from two or more corresponding heat sources (e.g., segmented heatsink 106a corresponds to heat sources 104a and 104b, segmented heatsink 106d corresponds to heat sources 104c-104f, etc.). Each of segmented heatsinks 106a-106c may be a passive cooling device or element or an active cooling device or element to help reduce the thermal energy or temperature of one or more corresponding heat sources. Each of electronics 108 can be a device or group of devices available to assist in the operation or function of the electronic device that includes electronics 108.

In an example, each of segmented heatsinks 106a-106c can include a segment, extension, branch, etc. that extends over a heat source. More specifically, segmented heatsink 106a can include two independent segments where the first segment extends over heat source 104a and the second segment extends over heat source 104b. Also, segmented heatsink 106b can include four independent segments where the first segment extends over heat source 104c, the second segment extends over heat source 104d, the third segment extends over heat source 104e, and the fourth segment extends over heat source 104f. In another example, segmented heatsink 106b can include three independent segments where the first segment extends over heat source 104c, the second segment extends over heat source 104d, and the third segment extends over heat sources 104e and 104f. The geometry of each segment allows the loading mechanism of each segmented heatsink and heat pipe routing (if applicable) to be configured to permit independent vertical travel of a specific segment over a corresponding heat source. In other words, the vertical travel and/or applied load from a first heatsink segment is independent, not associated with, impacted by, etc. the vertical travel and/or applied load from a second heatsink segment or any other heatsink segment.

In a specific example, each segment of each segmented heatsink allows each segmented heatsink to conform to the as-built heights of each heat source. This can help ensure thermal performance of the heatsink, a relatively thin and uniform thermal interface material (TIM), and help to reduce pressure concentrations across a wide range of heat source heights. The constituent elements of each segmented heatsink can be manufactured using current methods and materials and can be adapted to different package geometries and die layouts. This enables a wider array of multi-chip packages (MCPs) with disaggregated or partitioned high-power dies than traditional monolithic cold plates. In some examples, the number of the securing means that secures the segmented heatsink to a printed circuit board (PCB) is equal to or less than twice the amount of the heat sources.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

Elements of FIG. 1 may be coupled to one another through one or more interfaces employing any suitable connections (wired or wireless), which provide viable pathways for network (e.g., network 116, etc.) communications. Additionally, any one or more of these elements of FIG. 1 may be combined or removed from the architecture based on particular configuration needs. Network 116 may include a configuration capable of transmission control protocol/Internet protocol (TCP/IP) communications for the transmission or reception of packets in a network. Each of electronic devices 102a-102c may also operate in conjunction with a user datagram protocol/IP (UDP/IP) or any other suitable protocol where appropriate and based on particular needs.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems.

For example, in some devices, it can be difficult to cool a particular heat source, especially when there are more than two heat sources relatively close together and/or the heat sources have different heights. Often, when two or more heat sources are relatively close together, each heat source has a different height or the heat sources are at a different height relative to each other due to tolerances, warpage, imperfections, etc. The different height of each heat source can cause problems with the TIM and pressure concentrations on the TIM and solder balls.

More specifically, thermal solutions for mobile client form factors are designed to generate a thin, uniform layer of TIM at the interface with the system-on-chip (SoC). This is critical for steady-state and transient (e.g., PL2/turbo) thermal performance, and for minimizing the risk of damage to thin SoC packages (e.g., die crack, solder joint failure, etc.). Disaggregation and die-partitioning can exacerbate this existing challenge, specifically in scenarios when two or more high-power dies are located in very close proximity to each other, (e.g., due to high-speed signal routing needs and/or the use of various in-package interconnect technologies (e.g., EMIB requires one hundred micrometers die-to-die spacing)). Die thickness tolerances and package assembly tolerances can cause as-built die heights to vary on the order of about ten (10) to about twenty (20) micrometer, which is non-negligible in comparison with the about twenty (20) to about thirty (30) micrometer TIM thickness typically required for high-power dies. When one of the dies in close proximity is low-power, this may be acceptable. However, for two high-power dies (e.g., a CPU plus a graphics processing unit (GPU)), this can generate an intractable trade-off between achieving a thin TIM and optimal thermal performance for both dies, while also avoiding the high forces and local pressures that cause solder joint failure and die crack. Various systems have attempted to address the variation in die height, but each system has limitations. Systems that rely on thermal solution and motherboard bending to accommodate the die height variation only work if the pair of high-power dies are relatively far apart (e.g., tens of millimeters).

One solution to address the different die heights is to fabricate a cold plate with a high-precision step or pedestal feature to make contact with the shorter die(s). Typically, this would be solved using a pedestal feature in the cold plate, which can be fabricated by machining, grinding, forming, etc. However, using a pedestal feature has serious drawbacks because the tolerance of the pedestal feature itself must be considered additive to the die height tolerances, which can cause pedestal solutions to be even more sensitive to die height and thermal solution tolerances. In practice, even if a pedestal feature is made using a high-precision manufacturing method such as forming, machining, or even grinding, it will have a tolerance that exceeds that of the die heights themselves.

It is important to consider the die pressure sensitivity to a maximum load condition, which occurs as a function of the as-built condition of all the parts and features in the system that affect the load (namely, thermal solution springs, cold plate, back plate, package height, package, and board warpage, etc.). For the pedestal design approach, when the pedestal and a first die heights combine to generate maximum pressure on the first die, the TIM pressure on a second die is seriously degraded, even at maximum load condition. The pedestal feature tolerance makes the same sensitivity exhibited in the previous example even more severe and the loading mechanism cannot correct for this sensitivity. In addition, the thicker part of the cold plate could interfere with the other heat source or TIM over the second die.

In other systems, a low-power die can be deliberately sized to ensure that it is never taller than a high-power die; however, this can create design constraints. Some systems use alternate TIMs, such as a gap pad or gap filler, to absorb the height difference, but the gap pad or gap filler is relatively thick and typically have a high thermal resistance. Also, systems that allow grease TIM to absorb the die height difference only work well if one die is low-power. What is needed is a thermal solution design that can accommodate height differences in heat sources and does not rely on a monolithic cold plate for the heat sources.

A system to enable a segmented heatsink, as outlined in FIG. 1, can resolve these issues (and others). In an example, a segmented heatsink can be configured with two or more segments that can accommodate height differences of heat sources and does not rely on a monolithic cold plate for the heat sources. The segmented heatsink can be configured to allow for a maximum load condition, when a first heat source and a second heat source are at their tolerance extremes. The segmented heatsink can allow the lower of the two heat sources to not suffer the dramatic reduction in TIM pressure exhibited by a pedestal design. Rather, both heat sources experience a similar or balanced increase in TIM pressure. In addition, the segmented heatsink can be employed in a wide array of configurations to solve additional challenges related to die partitioning and disaggregation.

In addition, the segmented heatsink can reduce TIM pressure sensitivity to board and SoC package warpage resulting from the surface mount technology (SMT) process. Also, the segmented heatsink can be used with various types of loading mechanisms that can be designed and implemented to permit the required independent travel of different heatsink segments, including leaf springs, coil springs, torsion bars, load frames, clips, magnets, etc. The segmented heatsink can be implemented in systems with various numbers of heat pipes (or no heat pipes) and/or high-power dies.

In some examples, the segmented heatsink can minimize the need for additional heatsink mounting holes in the PCB or system when a heat sources is added to an already-existing system design. As an example, if an existing system has one primary heat source (e.g., a CPU die), it may have three to four mounting holes where the heatsink is attached to the main PCB and/or system chassis. If that same system were reconfigured to include a secondary heat source (e.g., a GPU die, another CPU die, etc.) of comparable power/thermal characteristics as the primary heat source on the same substrate as the primary heat source, the secondary heat source may warrant its own dedicated heatsink and its own set of three to four mounting holes for attachment to the main PCB and/or system chassis. As such, the total number of heatsink attachment points in the main PCB and/or system chassis grows to six to eight when two fully independent and fully separate heat sinks are used. With the segmented heatsink, the number of attachment points can be limited to four, which is comparable to the number used (three to four) in most current systems with only one primary heat source. In an example, the number of the mounting holes or securing means in the PCB for the segmented heatsink is equal to or less than twice the amount of the number of heat sources on the substrate An alternate instantiation of the segmented heatsink involves using a split heatsink thermal solution for an MCP with two high-power dies that have different nominal heights and are located in close proximity (e.g., less than two (2) millimeters apart, about one hundred (100) micrometers apart, etc.). A gap of about 0.5 to about 1.0 mm between heatsink partitions is sufficient to permit relying on current design elements (e.g., back plate solder nuts, mother board drilled holes, formed leaf springs, formed cold plates, etc.). If tighter tolerances and/or narrower gaps are desired, dedicated alignment features may be needed (e.g., reamed motherboard or spring holes, shoulder screws, pins, other alignment features, etc.).

Turning to the infrastructure of FIG. 1, network 116 represents a series of points or nodes of interconnected communication paths for receiving and transmitting packets of information. Network 116 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 116, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102a-102c, are meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes at least two heat sources, especially two heat sources that are relatively close together and/or are at different heights or are at a different height relative to each other. Each of electronic devices 102a-102c may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102a-102c may include virtual elements.

In regards to the internal structure, each of electronic devices 102a-102c can include memory elements for storing information to be used in the operations outlined herein. Each of electronic devices 102a-102c may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

Additionally, each of heat sources 104a-104i may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
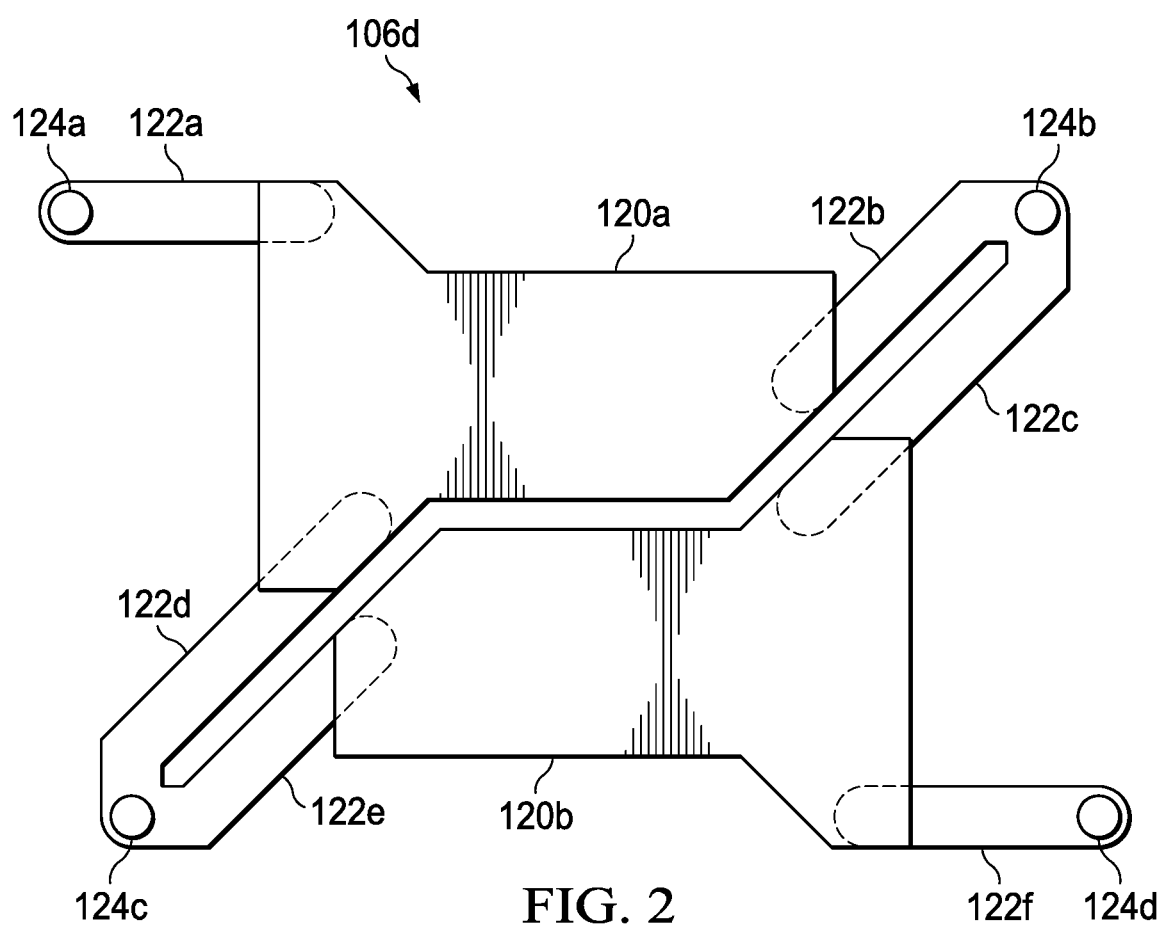
FIG. 2 is a simplified block diagram of a segmented heatsink, in accordance with an embodiment of the present disclosure.

Turning to FIG. 2, FIG. 2 is a simplified block diagram of a segmented heatsink 106d. Segmented heatsink 106d can include a first heatsink segment 120a, a second heatsink segment 120b, loading arms 122a-122f, and securing means 124a-124d. First heatsink segment 120a and second heatsink segment 120b may each be an element in an active cooling device or a passive cooling device. Loading arms 122a, 122b, and 122d can be coupled to first heatsink segment 120a and can be configured to apply a load on first heatsink segment 120a when first heatsink segment 120a is over a first heat source. Loading arms 122c, 122e, and 122f can be coupled to second heatsink segment 120b and can be configured to apply a load on second heatsink segment 120b when second heatsink segment 120b is over a second heat source. It should be noted that the profile or geometry of segmented heatsink 106d is for illustration purposes only and other profiles or geometries may be used depending on the system design.

First heatsink segment 120a may be a passive cooling device or element or an active cooling device or element to help reduce the thermal energy or temperature of one or more corresponding heat sources. In addition, second heatsink segment 120b may be a passive cooling device or element or an active cooling device or element to help reduce the thermal energy or temperature of one or more corresponding heat sources. Also, first heatsink segment 120a may be comprised of the same material or of a different material than second heatsink segment 120b. Securing means 124a-124d can be configured to allow segmented heatsink 106d to be coupled to a PCB. In an illustrative example, loading arm 122a extends from securing means 124a, loading arms 122b and 122c extend from securing means 124b, loading arms 122d and 122e extend from securing means 124c, and loading arm 122f extends from securing means 124d.

Each of loading arms 122a-122f can be comprised of alloy steel, stainless steel, copper, beryllium-copper alloys, or some other type of material that will allow loading arms 122a-122f to create an applied load on a corresponding heat source. Loading arms 122a, 122b, and 122d create an applied load on first heatsink segment 120a when segmented heat sink 106d is coupled to a system using securing means 124a-124c. The applied load is created by securing means 124a-124c being lower than the height of a heat source under first heatsink segment 120a. When first heatsink segment 120a is positioned over or on the heat source, loading arms 122a, 122b, and 122d extend from securing means 124a-124c respectively and push down or on first heatsink segment 120a to create the applied load. Similarly, loading arms 122c, 122e, and 122f create an applied load on second heatsink segment 120b when the segmented heat sink 106d is coupled to the system using securing means 124a-124d. The applied load is created by securing means 124b-124d being lower than the height of a heat source under second heatsink segment 120b. When second heatsink segment 120b is positioned over or on the heat source, loading arms 122c, 122e, and 122f extend from securing means 124b-124d respectively and push down or on second heatsink segment 120b to create the applied load. Other types of loading mechanisms not illustrated in FIG. 2 may also be used (e.g., load frames, coil springs, torsional springs, clips, magnets, etc.).

Loading arms 122a-122f can accommodate different heights of heat sources by virtue of their design. More specifically, the bending and displacement of loading arms 122b and 122c are relatively independent of each other, even though they share a common securing means 124b. Similarly, the bending and displacement of loading arms 122d and 122c are relatively independent of each other, even though they share a common securing means 124c. This allows first heatsink segment 120a and second heatsink segment 120b to be relatively independent of each other and each can apply a different load, force, pressure, etc. on a corresponding heat source. For example, the load, force, pressure, etc. can be adjusted by adjusting the height of the securing means, the material and/or thickness of the loading arms, the length of the loading arms, etc.

Figure 3:
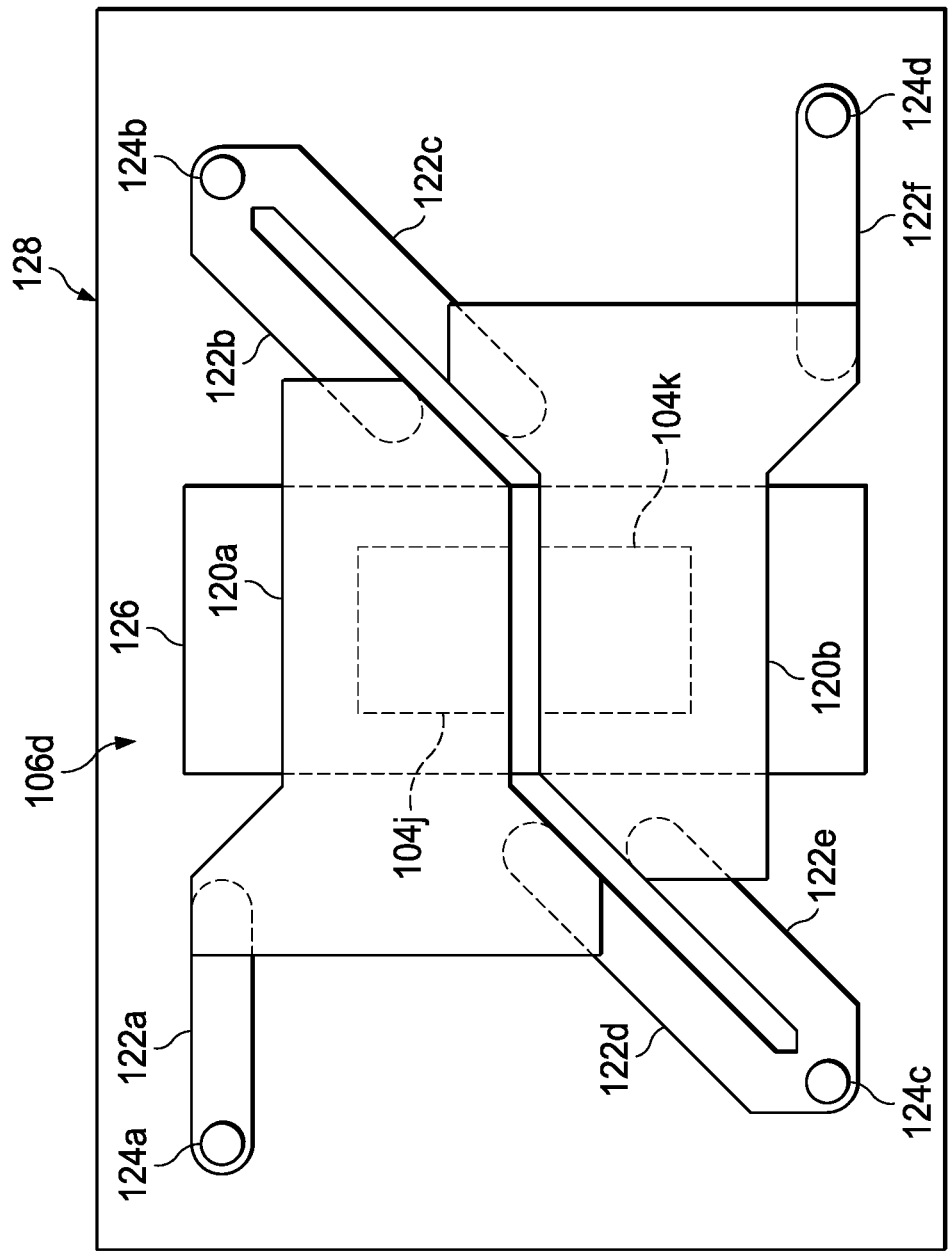
FIG. 3 is a simplified block diagram of a system to enable a segmented heatsink, in accordance with an embodiment of the present disclosure.

Turning to FIG. 3, FIG. 3 is a simplified block diagram of segmented heatsink 106d coupled to heat sources 104j and 104k. Heat sources 104j and 104k can be located over a substrate 126. Substrate 126 can be over a PCB 128. Segmented heatsink 106d can include first heatsink segment 120a, second heatsink segment 120b, loading arms 122a-122f, and securing means 124a-124d. Using securing means 124a-124d, segmented heatsink 106d can be secured to PCB 128. More specifically, loading arms 122a-122f and securing means 124a-124d may be comprised of various common mechanisms such as leaf springs, load frames, coil springs, torsional springs, clips, screws, pins, magnets, etc. that allow segmented heatsink 106d to be secured to PCB 128 while generating force and pressure on heat sources 104j and 104k.

In an illustrative example, heat source 104j may have a different height than heat source 104k or heat source 104j may be at a different height relative to heat source 104k due to tolerances, warpage, imperfections, etc. First heatsink segment 120a can be over heat source 104j and second heatsink segment 120b can be over heat source 104k. Because first heatsink segment 120a is supported by loading arms 122a, 122b, and 122d and second heatsink segment 120b is supported by loading arms 122c, 122e, and 122f, segmented heatsink 106d can accommodate the different heights of heat source 104j and heat source 104k.

Figure 4:
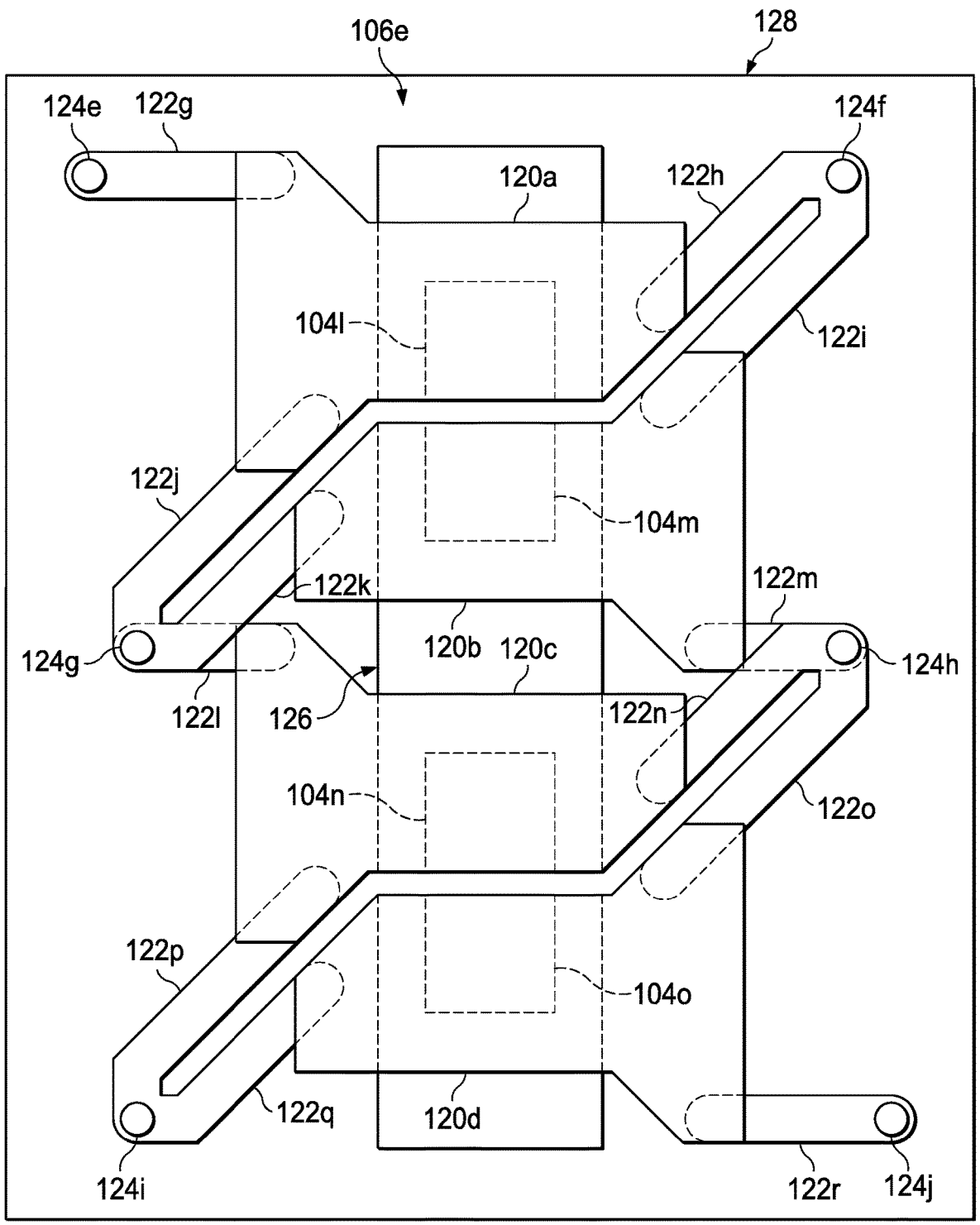
FIG. 4 is a simplified block diagram of a system to enable a segmented heatsink, in accordance with an embodiment of the present disclosure.

Turning to FIG. 4, FIG. 4 is a simplified block diagram of segmented heatsink 106e coupled to heat sources 104l-104o. Heat sources 104l-104o can be located over substrate 126. Substrate 126 can be over PCB 128. Using securing means 124e-124j, segmented heatsink 106d can be secured to PCB 128.

In an illustrative example, loading arms 122g, 122h, and 122j can be coupled to first heatsink segment 120a and configured to create an applied load on first heatsink segment 120a. Loading arm 122g can be coupled to securing means 124e, loading arm 122h can be coupled to securing means 124f, and loading arm 122j can be coupled to securing means 124g. In addition, loading arms 122i, 122k, and 122m can be coupled to second heatsink segment 120b and configured to create an applied load on second heatsink segment 120b. Loading arm 122i can be coupled to securing means 124f, loading arm 122k can be coupled to securing means 124g, and loading arm 122m can be coupled to securing means 124h. Further, loading arms 122l, 122n, and 122p can be coupled to third heatsink segment 120c and configured to create an applied load on third heatsink segment 120c. Loading arm 122l can be coupled to securing means 124g, loading arm 122n can be coupled to securing means 124h, and loading arm 122p can be coupled to securing means 124i. Also, loading arms 122o, 122q, and 122r can be coupled to fourth heatsink segment 120d and configured to create an applied load on fourth heatsink segment 120d. Loading arm 122o can be coupled to securing means 124h, loading arm 122q can be coupled to securing means 124i, and loading arm 122r can be coupled to securing means 124j.

Figure 5A:
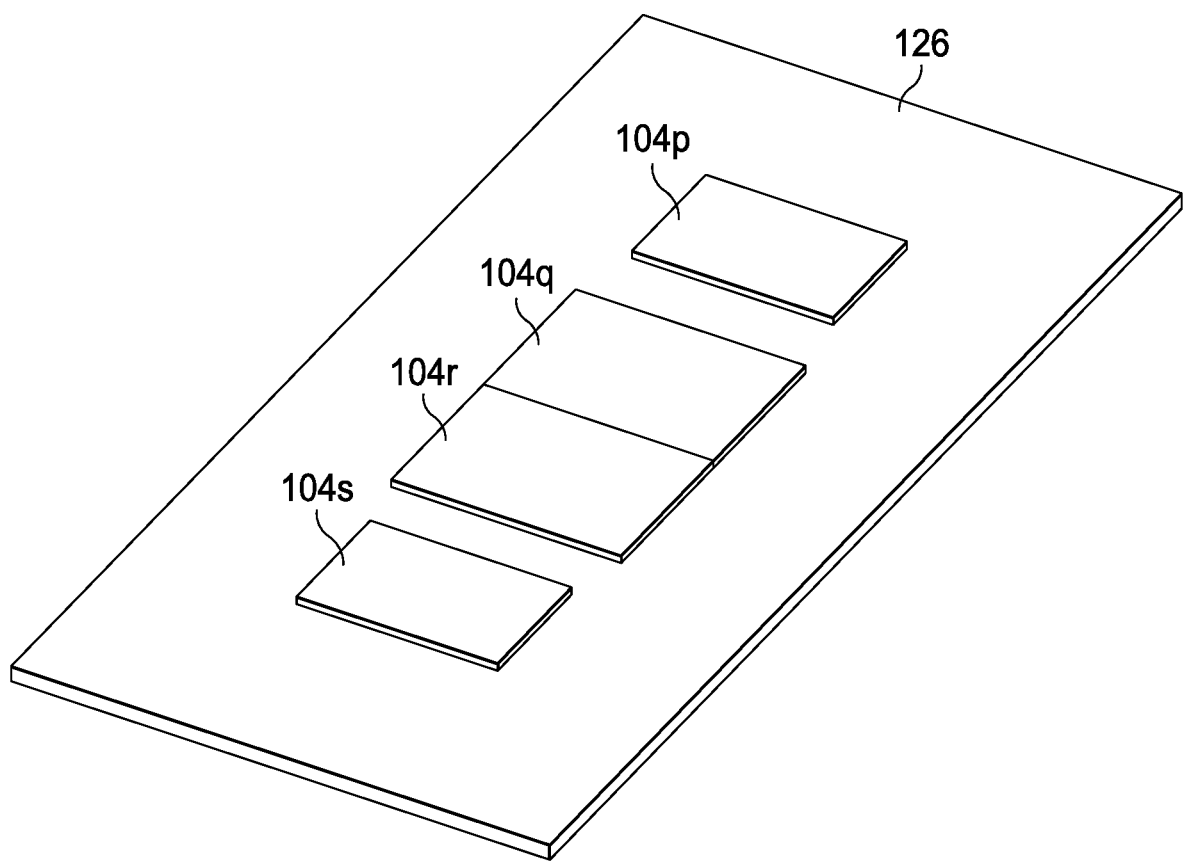
FIG. 5A is a simplified block diagram of a portion of a system to enable a segmented heatsink, in accordance with an embodiment of the present disclosure.

Turning to FIG. 5A, FIG. 5A is a simplified block diagram of a plurality of heat sources 104p-104s. As illustrated in FIG. 5A, heat sources 104p-104s can be on substrate 126. One or more of heat sources 104p-104s may have a different height than the other heat sources. For example, heat sources 104p and 104q may have a different height than heat sources 104r and 104s. Also, heat sources 104q and 104r may be relatively close together such that the tolerances are relatively tight. For example, heat sources 104q and 104r may be less than less than two (2) millimeters apart. In another example, heat sources 104q and 104r may be about one hundred (100) micrometers apart.

Figure 5B:
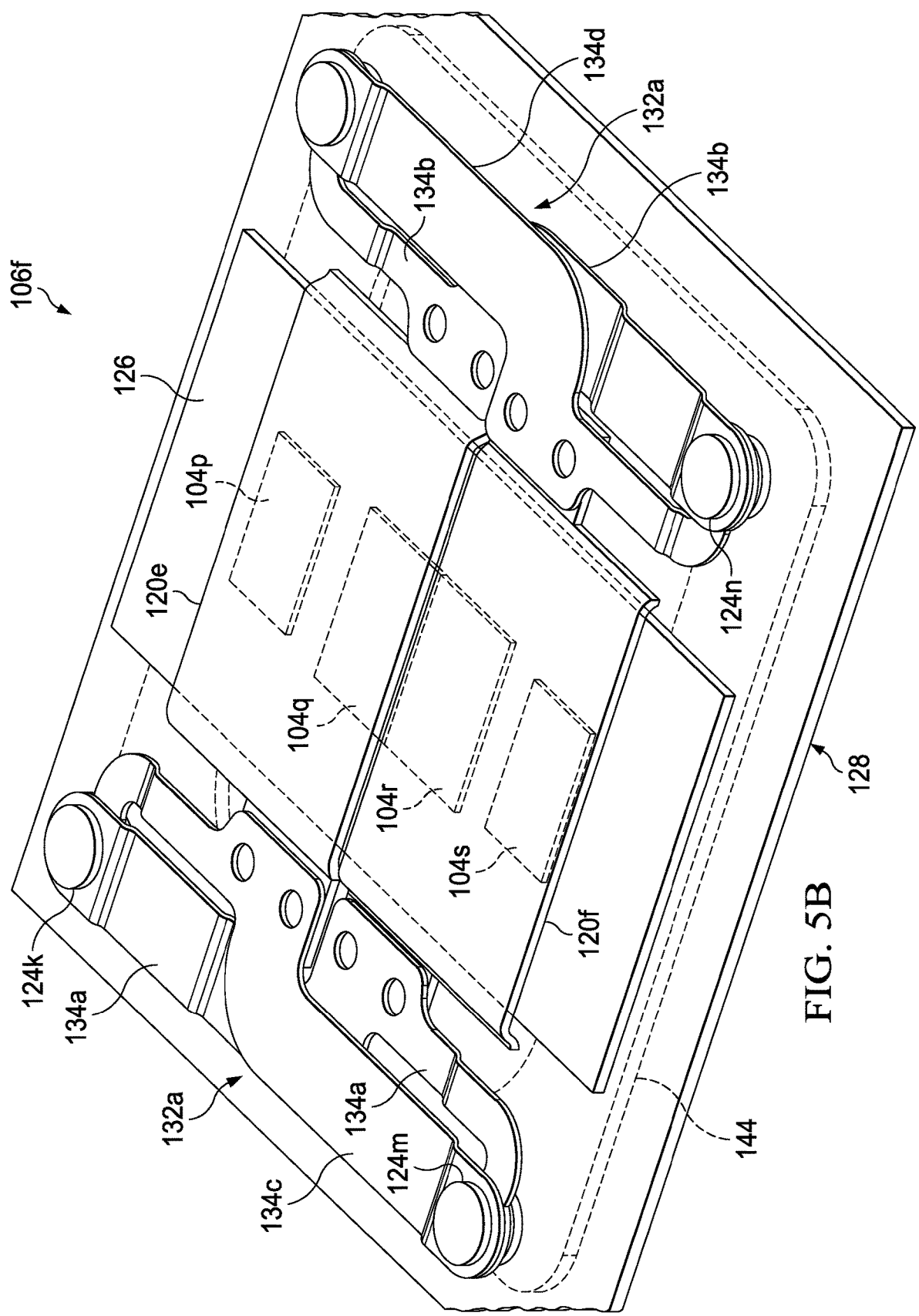
FIG. 5B is a simplified block diagram of a system to enable a segmented heatsink, in accordance with an embodiment of the present disclosure.

Turning to FIG. 5B, FIG. 5B is a simplified block diagram of segmented heatsink 106f coupled to heat sources 104p-104s. Segmented heatsink 106f can include securing means 124k-124n, segment loading supports 132a and 132b, and segment loading arms 134a-134d. In an example, a support plate 144 may be added under PCB 128. Support plate 144 may be a support plate, backing plate, bolster plate, or some other mechanism that can help provide support for heat sources 104p-104s, substrate 126, and/or segmented heatsink 106f as well as help to stiffen or support PCB 128. In other examples, support plate 144 may not be present. Segment support 132a can be coupled to segment loading arm 134a and segment loading arm 134c. Segment support 132b can be coupled to segment loading arm 134b and 134d.

Each of segment loading supports 132a and 132b are configured to generate a different independent applied load, while using a shared set of securing means 124k-124n, and without interfering with each other as each of segment loading supports 132a and 132b travel through their full range of displacement during device assembly. Segment loading arms 134a-134d are configured to create an applied load on a heatsink segment. More specifically, segment loading arms 134b and 134c can be configured to create an applied load on heatsink segment 120e. The applied load is created by the design, configuration, profile, etc. of segment loading arms 134b and 134c and/or securing means 124k-124n being lower than the height of a heat source(s) under heatsink segment 120e. When heatsink segment 120e is positioned over or on a heat source, segment loading arms 134b and 134c extend from securing means 124k-124n respectively and cause heatsink segment 120e to push down or on heat sources 104p and 104q and create the applied load. In addition, segment loading arms 134a and 134d are configured to create an applied load on heatsink segment 120f. The applied load is created by the design, configuration, profile, etc. of segment loading arms 134a and 134d and/or securing means 124k-124n being lower than the height of a heat source(s) under heatsink segment 120f. When heatsink segment 120f is positioned over or on a heat source, segment loading arms 134a and 134d extend from securing means 124k-124n respectively and cause heatsink segment 120f to push down or on heat sources 104r and 104s and create the applied load.

If heat sources 104q and 104r are relatively close together (e.g., less than two (2) millimeters apart, about one hundred (100) micrometers apart, etc.) such that the tolerances are relatively tight, it can be difficult to align two separate cold plates and/or to mount the two separate cold plates close together. More specifically, to mount and align two separate cold plates relatively close together, designers run into mounting issues, the need for a larger motherboard, tolerance issues, etc. Segmented heatsink 106f allows for a set of attachment points that are comparable to those commonly used in current systems, while still allowing for the benefit of two heatsink segments.

Figure 5C:
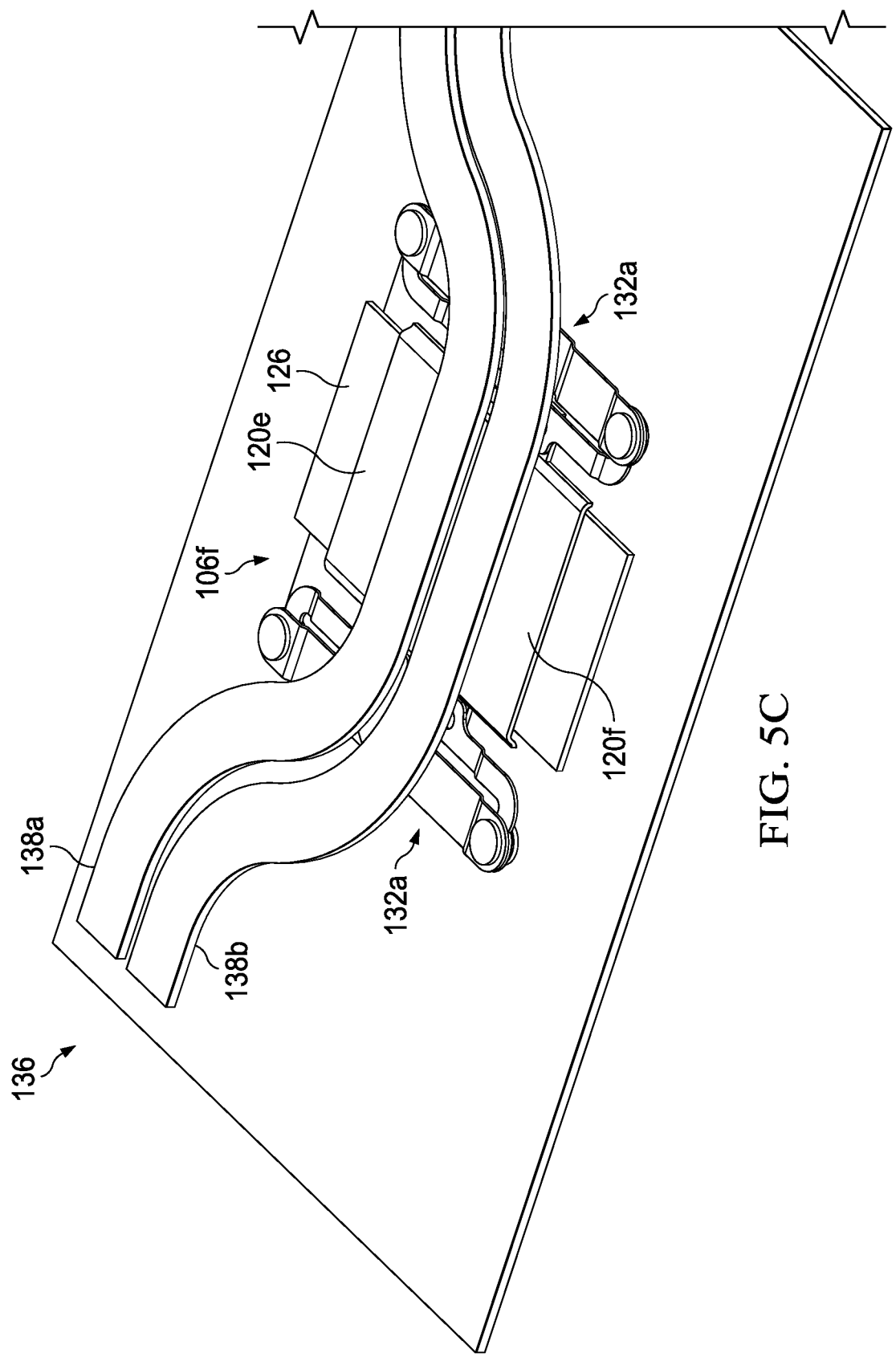
FIG. 5C is a simplified block diagram of a system to enable a segmented heatsink, in accordance with an embodiment of the present disclosure.

Turning to FIG. 5C, FIG. 5C is a simplified block diagram of segmented heatsink 106f coupled to heat sources 104p-104s. Because segmented heatsink 106f allows for a set of attach points that are comparable to those commonly used in current systems while still allowing for the benefit of two heatsink segments, other elements around segmented heatsink 106f can be configured as if segmented heatsink 106f was a single heatsink as far as how segmented heatsink 106f relates with the other elements (the number of heat exchangers, the way the heat pipes are shared, the routing of the heat pipes, the number of holes or mounting locations in the circuit board, etc.). In an example, a heat pipe 136 can be coupled to segmented heatsink 106f to help draw heat and thermal energy away from heat sources 104p-104s. In a specific example, heat pipe 136 may include a specific heat pipe chamber for each heatsink segment. For example, heat pipe 136 can include heat pipe chambers 138a and 138b. Heat pipe chamber 138a may correspond to heatsink segment 120e and heat pipe chamber 138b may correspond to heatsink segment 120f.

Figure 6:
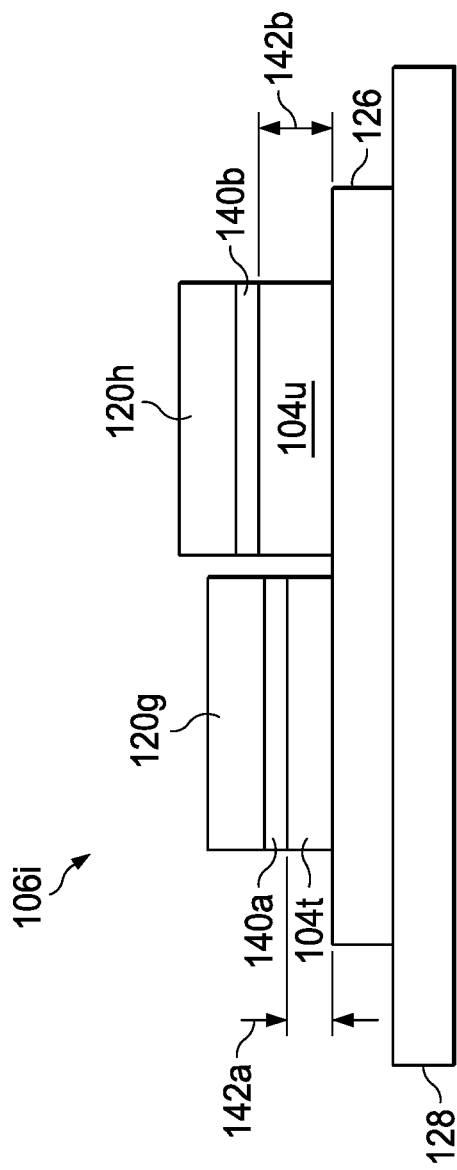
FIG. 6 is a simplified block diagram of a portion of a system to enable a segmented heatsink, in accordance with an embodiment of the present disclosure.

Turning to FIG. 6, FIG. 6 is a simplified block diagram of a portion of a segmented heatsink (e.g., segmented heatsink 106d or some other segmented heatsink with a different configuration or profile) coupled to heat sources 104t and 104u. In an example, a TIM can be between each heatsink segment and corresponding heat source. For example, a TIM 140a can be between heatsink segment 120g and heat source 104t and a TIM 140b can be between heatsink segment 120h and heat source 104u. In an example, TIM 140b may be about twenty (20) to about thirty (30) micrometers in thickness after the compressive load from heatsink segment 120h is applied.

As illustrated in FIG. 6, a heat source height 142a for heat source 104t is lower than a heat source height 142b for heat source 104u. Because of the height difference, if a solid cold plate were to be used, either a thicker TIM 140a would be needed or heat source 104t would need to be raised. However, because the segmented heatsink can accommodate the different heights of heat source 104t and 104u, a relatively thin TIM can be used. More specifically, TIM 140a may be about twenty (20) to about thirty (30) micrometers in thickness after the compressive load from heatsink segment 120g is applied.

Figure 7:
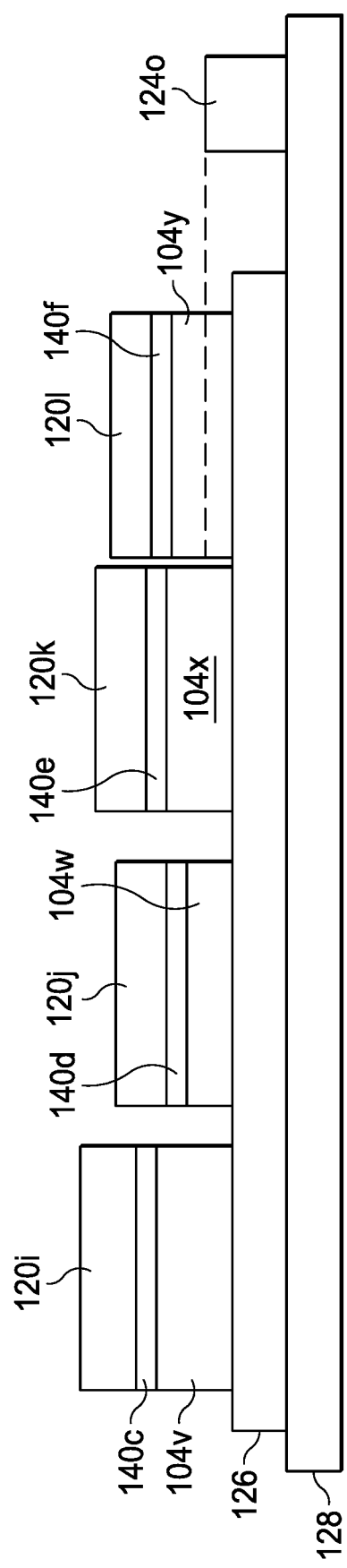
FIG. 7 is a simplified block diagram of a portion of a system to enable a segmented heatsink, in accordance with an embodiment of the present disclosure.

Turning to FIG. 7, FIG. 7 is a simplified block diagram of a portion of a segmented heatsink (e.g., segmented heatsink 106e or some other segmented heatsink with a different configuration or profile) coupled to heat sources 104v-104y. Heat sources 104v-104v can be over substrate 126. Substrate 126 can be over PCB 128. PCB 128 can include securing means 124o. In an example, a TIM can be between each heatsink segment and corresponding heat source. For example, a TIM 140c can be between heatsink segment 120i and heat source 104v, a TIM 140d can be between heatsink segment 120j and heat source 104w, a TIM 140e can be between heatsink segment 120k and heat source 104x, and a TIM 140f can be between heatsink segment 120l and heat source 104y.

As illustrated in FIG. 7 heat source 104w is lower in height than heat source 104v and 104x. Because of the height difference, if a solid cold plate were to be used, either a thicker TIM 140d would be needed or heat source 104w would need to be raised. However, because the segmented heatsink can accommodate the different heights of heat source 104w and 104v and 104x, a relatively thin TIM can be used. In addition, heat source 104x and 104y are relatively close together. The segmented heatsink can accommodate the needed tolerance while still providing a good thermal solution for heat source 104a and 104y.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although segmented heatsinks 106a-106f been illustrated with reference to particular elements and operations, these elements and operations may be replaced by any suitable architecture, profile, geometry, and/or configuration that achieves the intended functionality of segmented heatsinks 106a-106f.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device can include a printed circuit board, a substrate, where the substrate is over the printed circuit board, at least two heat sources over the substrate, and a segmented heatsink secured to the printed circuit board, where the segmented heatsink has at least two independent heatsink segments, where each heatsink segment corresponds to at least one heat source and is configured to draw heat from the corresponding heat source.

In Example A2, the subject matter of Example A1 can optionally include where the at least two heat sources are at a different height.

In Example A3, the subject matter of any one of Examples A1-A2 can optionally include where the at least two heat sources are less than two millimeters apart.

In Example A4, the subject matter of any one of Examples A1-A3 can optionally include where each heatsink segment applies a different load on a corresponding heat source.

In Example A5, the subject matter of any one of Examples A1-A4 can optionally include where the at least two heat sources are high powered dies.

In Example A6, the subject matter of any one of Examples A1-A5 can optionally include a plurality of securing means, where the segmented heatsink is secured to the printed circuit board using the plurality of securing means and a height of the plurality of securing means is less than a height of the at least two heat sources.

In Example A7, the subject matter of any one of Examples A1-A6 can optionally include where a number of the plurality of securing means is equal to or less than twice the amount of the at least two heat sources on the substrate.

Example M1 is a method including identifying at least two heat sources on a substrate, where the substrate is over a printed circuit board and securing a segmented heatsink to the printed circuit board, where the segmented heatsink has at least two independent heatsink segments, where each heatsink segment corresponds to at least one heat source and is configured to draw heat from the corresponding heat source.

In Example M2, the subject matter of Example M1 can optionally include where the at least two heat sources are at a different height relative to each other.

In Example M3, the subject matter of any one of the Examples M1-M2 can optionally include where the at least two heat sources are less than two millimeters apart.

In Example M4, the subject matter of any one of the Examples M1-M3 can optionally include where each heatsink segment applies a different load on a corresponding heat source.

In Example M5, the subject matter of any one of the Examples M1-M4 can optionally include where the at least two heat sources are high powered dies.

In Example M6, the subject matter of any one of the Examples M1-M5 can optionally include where the at least two heat sources are at a different height relative to each other and each segment applies a different load on a corresponding heat source.

In Example M7, the subject matter of any one of the Examples M1-M6 can optionally include securing the segmented heatsink to the printed circuit board using a plurality of securing means, where a number of the plurality of securing means is equal to or less than twice the amount of the at least two heat sources on the substrate.

Example AA1 is segmented heatsink configured to extend over at least two heat sources. The segmented heatsink can include a plurality of securing means, loading arms extending from the securing means, and at least two independent heatsink segments supported by at least two of the loading arms, where each heatsink segment corresponds to at least one heat source from the at least two heat sources and is configured to remove heat from the corresponding at least one heat source.

In Example AA2, the subject matter of Example AA1 can optionally include where the at least two heatsink segments are at a different height.

In Example AA3, the subject matter of any one of the Examples AA1-AA2 can optionally include where the at least two heatsink segments are less than two millimeters apart.

In Example AA4, the subject matter of any one of the Examples AA1-AA3 can optionally include where each of the at least two heatsink segments applies a different load on the corresponding at least one heat source.

In Example AA5, the subject matter of any one of the Examples AA1-AA4 can optionally include where the segmented heatsink is secured to a printed circuit board using the plurality of securing means.

In Example AA6, the subject matter of any one of the Examples AA1-AA5 can optionally include where a number of the plurality of securing means is equal to or less than twice the amount of the at least two heat sources.

What is claimed is:

1. An electronic device comprising:
   a printed circuit board;
   a substrate, wherein the substrate is over the printed circuit board;
   at least two heat sources over the substrate;
   a plurality of physically separate securing means coupled to the printed circuit board;
   a plurality of physically separate segment loading arms, wherein at least one segment loading arm extends from each of the plurality of physically separate securing means and at least three segment loading arms extend from one or more of the physically separate securing means; and
   a segmented heatsink secured to the printed circuit board by at least a portion of the plurality of physically separate segment loading arms and at least a portion of the plurality of physically separate securing means, wherein the segmented heatsink has at least four independent heatsink segments, wherein each heatsink segment corresponds to at least one heat source and is configured to draw heat from the corresponding heat source, wherein at least three independent heatsink segments share at least one securing means from the plurality of physically separate securing means.

2. The electronic device of claim 1, wherein the at least two heat sources are less than two millimeters apart but physically separate from each other.

3. The electronic device of claim 1, wherein each heatsink segment applies a different load on a corresponding heat source.

4. The electronic device of claim 1, wherein the at least two heat sources are high powered dies.

5. The electronic device of claim 1, wherein a height of the plurality of physically separate securing means is less than a height of the at least two heat sources.

6. The electronic device of claim 5, wherein a number of the plurality of physically separate securing means is equal to or less than twice an amount of the at least two heat sources on the substrate.

7. The electronic device of claim 1, wherein a specific independent heatsink segment from the at least four independent heatsink segments is coupled to at least one specific segment loading arm from the plurality of physically separate segment loading arms, wherein the at least one specific segment loading arm coupled to the specific independent heatsink segment is not coupled to any other independent heatsink segment.

8. The electronic device of claim 1, wherein at least a portion of the plurality of physically separate segment loading arms create an applied load on the least two heat sources.

9. The electronic device of claim 1, wherein the at least four independent heatsink segments are structurally isolated from each other.

10. The electronic device of claim 1, wherein each of the plurality of physically separate segment loading arms extend from a specific securing means from the plurality of physically separate securing means to the segmented heatsink.

11. The electronic device of claim 1, wherein at least two independent heatsink segments apply a different load on a corresponding heat source.

12. A method comprising:
    identifying at least two heat sources on a substrate, wherein the substrate is over a printed circuit board and the at least two heat sources are at a different height relative to each other; and
    securing a segmented heatsink to the printed circuit board using a plurality of physically separate securing means coupled to the printed circuit board and a plurality of physically separate segment loading arms, wherein at least three segment loading arms extend from one or more of the plurality of physically separate securing means, wherein the segmented heatsink has at least four independent heatsink segments, wherein each heatsink segment corresponds to at least one heat source and is configured to draw heat from the corresponding heat source, wherein at least three independent heatsink segments share at least one securing means from the plurality of physically separate securing means.

13. The method of claim 12, wherein the at least two heat sources are less than two millimeters apart.

14. The method of claim 12, wherein each heatsink segment applies a different load on a corresponding heat source.

15. The method of claim 12, wherein the at least two heat sources are high powered dies.

16. A segmented heatsink configured to extend over at least two heat sources, the segmented heatsink comprising:
    a plurality of physically separate securing means coupled to a printed circuit board;
    a plurality of physically separate segment loading arms, wherein at least one segment loading arm extends from each of the plurality of physically separate securing means and at least three segment loading arms extend from one or more of the physically separate securing means; and
    at least three structurally independent heatsink segments, each supported by at least two segment loading arms from the plurality of physically separate segment loading arms, wherein each heatsink segment corresponds to at least one heat source from the at least two heat sources and is configured to remove heat from the corresponding at least one heat source, wherein the at least three structurally independent heatsink segments share at least one securing means from the plurality of physically separate securing means.

17. The segmented heatsink of claim 16, wherein the at least three structurally independent heatsink segments are less than two millimeters apart.

18. The segmented heatsink of claim 16, wherein the segmented heatsink is secured to the printed circuit board using the plurality of physically separate securing means.

* * * * *